(12) United States Patent
Kim et al.

(10) Patent No.: US 8,411,498 B2
(45) Date of Patent: Apr. 2, 2013

(54) MAGNETIC TUNNEL JUNCTION DEVICES, ELECTRONIC DEVICES INCLUDING A MAGNETIC TUNNELING JUNCTION DEVICE AND METHODS OF FABRICATING THE SAME

(75) Inventors: Kwang-seok Kim, Seongnam-si (KR); Kee-won Kim, Suwon-si (KR); Sun-ae Seo, Hwaseong-si (KR); Seung-kyo Lee, Gwangju (KR); Young-man Jang, Gwangju (KR)

(73) Assignees: Samsung Electronics Co., Ltd., Gyeonggi-do (KR); Gwangju Institute of Science and Technology, Gwangju (KR)

( * ) Notice: Subject to any disclaimer, the term of this patent is extended or adjusted under 35 U.S.C. 154(b) by 272 days.

(21) Appl. No.: 12/923,377

(22) Filed: Sep. 17, 2010

(65) Prior Publication Data

US 2011/0141803 A1   Jun. 16, 2011

(30) Foreign Application Priority Data

Dec. 15, 2009   (KR) ................. 10-2009-0125036

(51) Int. Cl.
*G11C 11/14*   (2006.01)
(52) U.S. Cl. ........ 365/171; 365/148; 365/158; 365/173; 977/933; 977/935
(58) Field of Classification Search ............ 365/48, 365/55, 62, 66, 74, 78, 80–93, 100, 130, 365/131, 148, 158, 171–173, 209, 213, 225.5, 365/230.07, 232, 243.5; 257/295, 421, E21.665; 438/3; 977/933–935

See application file for complete search history.

(56) References Cited

U.S. PATENT DOCUMENTS 6,967,863 B2   11/2005 Huai
7,313,013 B2 *   12/2007 Sun et al. ............. 365/158
(Continued)

FOREIGN PATENT DOCUMENTS

JP   62232740 A   10/1987
JP   08-045267 A   2/1996
(Continued)

OTHER PUBLICATIONS

M. Nakayama, et al., "Spin transfer switching in TbCoFe/CoFeB/MgO/CoFeB/TbCoFe magnetic tunnel junctions with perpendicular magnetic anistropy," Journal of Applied Physics, vol. 103, pp. 07A710-1-07171-3 (2008).

*Primary Examiner* — Harry W Byrne
(74) *Attorney, Agent, or Firm* — Harness, Dickey & Pierce, P.L.C.

(57) ABSTRACT

Perpendicular magnetic tunnel junction (MTJ) devices, methods of fabricating a perpendicular MTJ device, electronic devices including a perpendicular MTJ device and methods of fabricating the electronic device are provided, the perpendicular MTJ devices include a pinned layer, a tunneling layer and a free layer. At least one of the pinned layer and the free layer includes a multi-layered structure including an amorphous perpendicular magnetic anisotropy (PMA) material.

24 Claims, 7 Drawing Sheets

U.S. PATENT DOCUMENTS

| | | | |
|---|---|---|---|
| 7,596,015 B2 * | 9/2009 | Kitagawa et al. | 365/158 |
| 8,064,244 B2 * | 11/2011 | Zhang et al. | 365/158 |
| 8,228,715 B2 * | 7/2012 | Andre et al. | 365/158 |
| 2001/0031374 A1 | 10/2001 | Whang et al. | |
| 2005/0185455 A1 | 8/2005 | Huai | |
| 2006/0104110 A1 * | 5/2006 | Sun et al. | 365/173 |
| 2008/0088980 A1 * | 4/2008 | Kitagawa et al. | 360/313 |
| 2009/0257151 A1 * | 10/2009 | Zhang et al. | 360/324.2 |
| 2011/0292714 A1 * | 12/2011 | Andre et al. | 365/148 |

FOREIGN PATENT DOCUMENTS

| | | |
|---|---|---|
| JP | 10-134438 A | 5/1998 |
| JP | 11-086236 A | 3/1999 |
| KR | 2001-0095789 A | 11/2001 |

\* cited by examiner

MAGNETIC TUNNEL JUNCTION DEVICES, ELECTRONIC DEVICES INCLUDING A MAGNETIC TUNNELING JUNCTION DEVICE AND METHODS OF FABRICATING THE SAME

CROSS-REFERENCE TO RELATED APPLICATIONS

This application claims the benefit of priority under 35 U.S.C. §119 from Korean Patent Application No. 10-2009-0125036, filed on Dec. 15, 2009, in the Korean Intellectual Property Office, the disclosure of which is incorporated herein in its entirety by reference.

BACKGROUND

1. Field

Example embodiments relate to magnetic tunnel junction devices, electronic devices including a magnetic tunnel junction device and methods of fabricating the same.

2. Description of the Related Art

In general, a horizontal magnetic tunnel junction (MTJ) using magnesium oxide (MgO) as a tunneling layer (hereinafter referred to as "horizontal MgO-MTJ") uses coherent tunneling in order to obtain a substantially high magnetic resistance (MR) ratio. In the horizontal MgO-MTJ, a tunneling layer has a structure including CoFeB/MgO/CoFeB.

In order to use the coherent tunneling, the texture of a material forming an interface with MgO is important. That is, the texturing, or crystallizing, of cobalt iron boron (CoFeB) with an annealing operation is important. In other words, it is important to crystallize CoFeB so that CoFeB may be crystallized according to the crystallization structure of MgO.

As the integrity of semiconductor devices increases, research on a perpendicular MTJ is being actively conducted. In addition, research involving the use of coherent tunneling is being conducted, specifically the use of MgO as a tunneling layer and the realization of a perpendicular MTJ having a substantially high MR ratio. In order to use the coherent tunneling in a perpendicular MTJ, research using an amorphous perpendicular magnetic anisotropy (PMA) material is being conducted. The amorphous PMA material may be an amorphous rare earth transition metal alloy.

The perpendicular MTJ is annealed at a temperature of about 300° C. in order to ensure a substantially high MR ratio. However, most of the amorphous rare earth transition metal alloys that are crystallized at an annealing temperature of about 300° C. lose their PMA characteristics.

SUMMARY

Example embodiments relate to magnetic tunnel junction devices, electronic devices including a magnetic tunnel junction device and methods of fabricating the same.

Provided are perpendicular magnetic tunnel junction (MTJ) devices having a substantially high magnetic resistance (MR) ratio due to an amorphous perpendicular magnetic anisotropy (PMA) material that maintains an amorphous status (or remains amorphous) during an annealing process. Provided are electronic devices including the perpendicular MTJ devices, and methods of manufacturing the perpendicular MTJ devices.

Additional aspects will be set forth in part in the description which follows and, in part, will be apparent from the description, or may be learned by practice of the presented embodiments.

According to example embodiments, a perpendicular magnetic tunnel junction (MTJ) device includes a pinned layer, a tunneling layer and a free layer, wherein at least one of the pinned layer and the free layer has a multi-layered structure including an amorphous perpendicular magnetic anisotropy (PMA) material.

The pinned layer may include at least a pair of material layers that are sequentially stacked.

The pair of material layers may be a first amorphous rare earth-transition metal (RE-TM) layer and a second amorphous RE-TM layer.

The free layer may include at least a pair of material layers that are sequentially stacked. The pair of material layers may be a first amorphous rare earth-transition metal (RE-TM) layer and a second amorphous RE-TM layer.

The first RE-TM layer may be a cobalt-iron (CoFe) layer, and the second RE-TM layer may be a terbium (Tb) layer. The first RE-TM layer may be a Tb layer, and the second RE-TM layer may be a CoFe layer.

The tunneling layer may include a magnesium oxide (MgO) layer. At least one of the pinned layer and the free layer may include an RE-TM layer doped with impurities, wherein the RE-TM layer contacts the MgO layer and is crystallized according to a crystallization structure of the MgO layer.

The RE-TM layer may be a CoFeB layer.

The perpendicular MTJ device may further include a pinning layer under the pinned layer, and a capping layer on the free layer.

According to example embodiments, a magnetic memory device includes a switching device, and a magnetic tunnel junction (MTJ) device connected to the switching device, wherein the MTJ device is the perpendicular MTJ device and at least one of the pinned layer and the free layer has a multi-layered structure including an amorphous perpendicular magnetic anisotropy (PMA) material.

According to example embodiments, a magnetic packet memory (MPM) includes an MTJ device, wherein the MTJ is the perpendicular MTJ device and at least one of the pinned layer and the free layer has a multi-layered structure including an amorphous perpendicular magnetic anisotropy (PMA) material.

According to example embodiments, a magnetic logic device configured to perform logic operations by using an MTJ device is provided, wherein the MTJ device is the perpendicular MTJ device and at least one of the pinned layer and the free layer has a multi-layered structure including an amorphous perpendicular magnetic anisotropy (PMA) material.

According to example embodiments, a method of manufacturing a perpendicular magnetic tunnel junction (MTJ) device includes stacking a pinning layer, a pinned layer, a tunneling layer and a free layer sequentially on a substrate, patterning the pinning layer, the pinned layer, the tunneling layer and the free layer to form an MTJ pattern, and annealing the MTJ pattern, wherein at least one of the pinned layer and the free layer is formed to have a multi-layered structure including an amorphous perpendicular magnetic anisotropy (PMA) material.

In the stacking of the pinning layer, the pinned layer, the tunneling layer and the free layer, the tunneling layer may include an MgO layer.

At least one of the pinned layer and the free layer may include a material layer directly contacting the MgO layer. The material layer may be formed as an amorphous material layer that is crystallized during annealing of the MTJ pattern.

At least one of the pinned layer and the free layer may include a material layer that does not contact the MgO layer.

The material layer may be formed as an amorphous RE-TM layer that is crystallized at a temperature higher than the crystallization temperature of the material layer contacting the MgO layer. The amorphous RE-TM layer may be a CoFe layer or a Tb layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
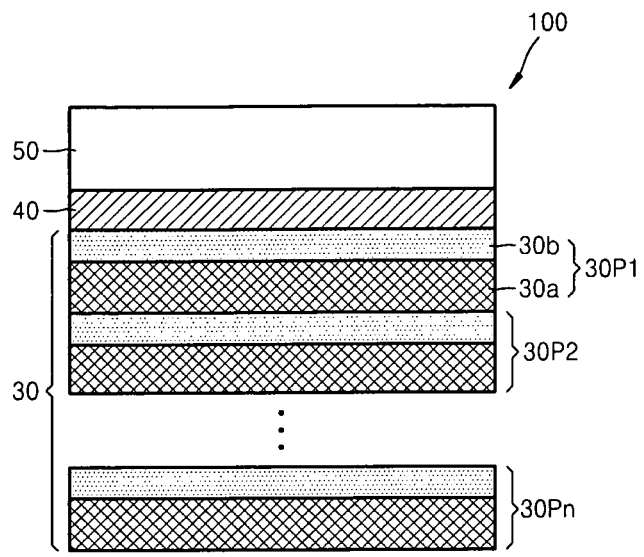
FIGS. 1 through 4 are cross-sectional views of perpendicular magnetic tunnel junction (MTJ) devices according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to magnetic tunnel junction devices, electronic devices including a magnetic tunnel junction device and methods of fabricating the same.

A perpendicular magnetic tunnel junction (MTJ) device according to example embodiments will be described as follows.

FIGS. 1 through 4 are cross-sectional views of perpendicular MTJ devices to according to example embodiments.

Referring to FIG. 1, a perpendicular MTJ device 100 includes a pinned layer 30, a tunneling layer 40 and a free layer 50. A pinning layer (described below) may be disposed under the pinned layer 30, but the pinning layer is omitted in FIG. 1 for the sake of convenience.

The pinned layer 30 may be an amorphous perpendicular magnetic anisotropy (PMA) material layer. The pinned layer 30 includes pairs of material layers 30P1, 30P2, 30Pn. Among the pairs of material layers 30P1, 30P2, 30Pn, the first material layer 30P1 includes a first rare earth-transition metal (RE-TM) layer 30a and a second RE-TM layer 30b. The first and second RE-TM layers 30a and 30b may be sequentially stacked on the pinning layer. The other material layers 30P2, 30Pn may each have the same structure as that of the first material layer 30P1. The first RE-TM layer 30a may be a cobalt-iron (CoFe) layer, a iron-platinum (FePt) layer or a cobalt-platinum (CoPt) layer, but other rare earth transition metals may be used as the first RE-TM layer 30a provided that the rare earth transition metals may be used as the pinned layer. The second RE-TM layer 30b may be a lanthanide. The second RE-TM layer 30b may be at least one selected from the group consisting of a terbium (Tb), gadolinium (Gd), dysprosium (Dy), holmium (Ho), erbium (Er), thulium (Tm), ytterbium (Yb), neodymium (Nd) layer and combinations thereof.

The tunneling layer 40 is formed (or configured) to perform coherent tunneling of a spin-polarized current, and may be formed to have a single-layer or multi-layered structure. When the tunneling layer 40 is a single layer, the tunneling layer 40 may be a magnesium oxide (MgO) layer. A material capable of performing a similar or an equivalent function to that of the MgO layer may be used as the tunneling layer 40. In addition, when the tunneling layer 40 is a single layer, the uppermost layer of the pinned layer 30 (that is, a magnetic layer contacting the tunneling layer 40) may be a single magnetic layer (not shown) doped with impurities, rather than a pair of material layers as described above. The single layer doped with impurities is crystallized according to a crystallization structure of the tunneling layer 40, for example, the single layer may be a cobalt-iron-boron (CoFeB) layer. A case where the tunneling layer 40 has a multi-layered structure is described below.

The free layer 50 is a magnetic layer having perpendicular magnetic anisotropic characteristics. The free layer 50 may be a magnetic layer, in which a magnetic moment freely varies depending on a polarized status of the spin-polarized current passing through the free layer 50. The free layer 50 may have a single-layer structure, or a multi-layered structure. The free layer 50 having the multi-layered structure is described below.

When the tunneling layer 40 is a single layer, the free layer 50 may include a single magnetic layer doped with impurities (not shown) which contacts an upper surface of the tunneling layer 40.

Figure 2:
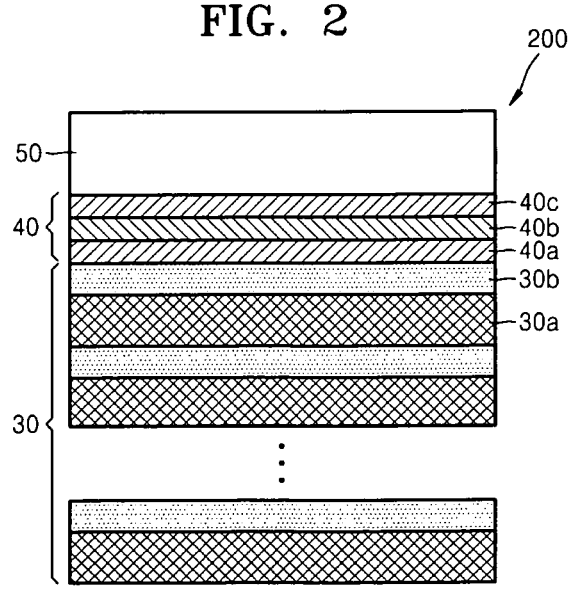

FIG. 2 is a cross-sectional view of a perpendicular MTJ device according to example embodiments.

Like reference numerals in FIG. 2 denote like elements as those of FIG. 1, and thus detailed descriptions thereof are not provided.

Referring to FIG. 2, a perpendicular MTJ device 200 includes the tunneling layer 40 having a plurality of material layers, namely, first through third tunneling layers 40a, 40b and 40c which are sequentially stacked. The first tunneling layer 40a is formed on the pinned layer 30. The first tunneling layer 40a is crystallized from an amorphous state. The first tunneling layer 40a is crystallized according to a crystallization structure of the second tunneling layer 40b. The first tunneling layer 40a may be a CoFeB layer, but a material layer having similar characteristics to those of CoFeB may also be used as the first tunneling layer 40a. A temperature at which the first tunneling layer 40a is crystallized may be lower than that of the pinned layer 30. A layer, collectively, including the first tunneling layer 40a and the pinned layer 30 may be commonly referred to as a "PMA layer."

The second tunneling layer 40b may be, for example, an MgO layer.

The third tunneling layer 40c is crystallized from an amorphous state. The third tunneling layer 40c is crystallized according to the crystallization structure of the second tunneling layer 40b. The third tunneling layer 40c may be a CoFeB layer, but a material layer having similar characteristics to those of CoFeB may also be used as the third tunneling layer 40c. The first and third tunneling layer 40a and 40c may be the same material layers.

The free layer 50 is formed on the third tunneling layer 40c. The crystallization temperature of the third tunneling layer 40c may be lower than that of the free layer 50.

Figure 3:
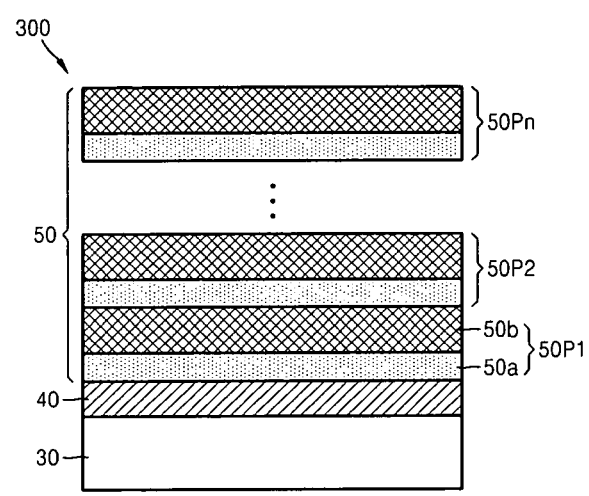

FIG. 3 is a cross-sectional view of a perpendicular MTJ device according to example embodiments.

Like reference numerals in FIG. 3 denote like elements as those of FIG. 1 and FIG. 2, and thus detailed descriptions thereof are not provided.

Referring to FIG. 3, a perpendicular MTJ device 300 includes the free layer 50 disposed on the tunneling layer 40. The free layer 50 may be an amorphous PMA material layer. The free layer 50 includes pairs of material layers 50P1, 50P2, ..., 50Pn.

Saturation magnetization of the free layer 50 may vary depending on the number and thickness of the pairs of material layers 50P1, 50P2, ..., 50Pn. Therefore, the number and thickness of the material layers 50P1, 50P2, ..., 50Pn included in the free layer 50 are appropriately adjusted in order to adjust the saturation magnetization of the free layer 50. For example, as the number of material layers in the free layer 50 is reduced, the saturation magnetization of the free layer 50 is reduced. As the number of material layers in the free layer 50 is increased, the saturation magnetization of the free layer 50 is also increased. When the number of material layers 50P1, 50P2, ..., 50Pn included in the free layer 50 is fixed, the saturation magnetization of the free layer 50 may be in proportion to the thickness of each material layer. Therefore, when the number and/or the thickness of the material layers 50P1, 50P2, ..., 50Pn included in the free layer 50 is adjusted, electric current for switching the magnetic polarization of the free layer 50 may be reduced.

The first material layer 50P1 includes a first RE-TM layer 50a and a second RE-TM layer 50b. The first and second RE-TM layers 50a and 50b may be sequentially stacked. The other material layers 50P2, ..., 50Pn may have the same structure as that of the first material layer 50P1. The material forming the first RE-TM layer 50a may be the same as the material forming the second RE-TM layer 30b of the pinned layer 30 shown in FIG. 1. The second RE-TM layer 50b may be, for example, a CoFe layer, FePt layer or CoPt layer. Other RE-TM materials may be used to form the second RE-TM layer 50b as long as the other RE-TM materials are generally used as (or include characteristics of) the free layer 50.

In FIG. 3, the tunneling layer 40 may include the first through third tunneling layers 40a, 40b and 40c as described with reference to FIG. 2. In this case, a layer collectively including the third tunneling layer 40c and the free layer 50 may be commonly referred to as a "PMA layer."

Figure 4:
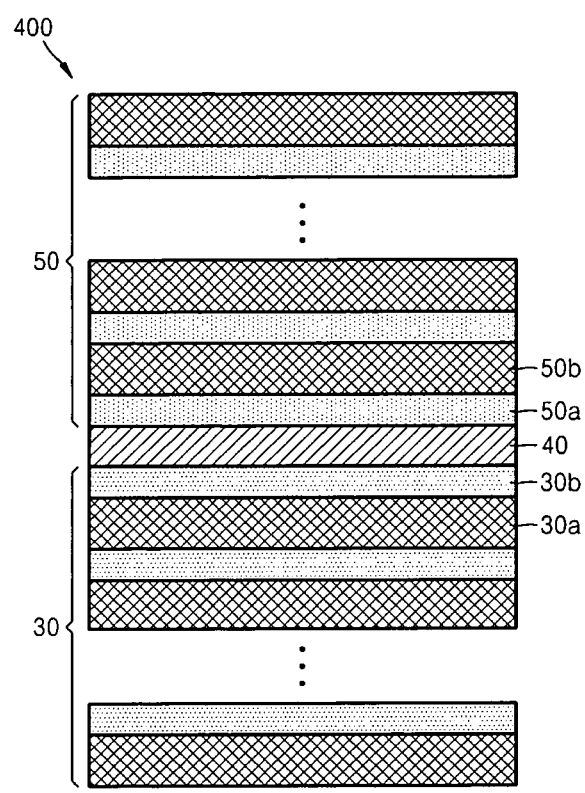

Referring to FIG. 4, the perpendicular MTJ according to example embodiments will be described later.

Like reference numerals in FIG. 4 denote like elements as those of FIGS. 1, 2 and 3, and thus detailed descriptions thereof are not provided.

The pinned layer 30 and the free layer 50 respectively include a plurality of material layers. Here, the pinned layer 30 is a lower PMA layer, and is the same as that of FIG. 2. In addition, the free layer 50 is an upper PMA layer, and is the same as that of FIG. 3.

In FIG. 4, a perpendicular MTJ device 400 includes the tunneling layer 40 that may include the first through third tunneling layers 40a, 40b and 40c as described with reference to FIG. 2. When the tunneling layer 40 includes the first through third tunneling layers 40a, 40b and 40c, a layer collectively including the pinned layer 30 and the first tunneling layer 40a may be commonly referred to as a "lower PMA layer." In addition, a layer collectively including the free layer 50 and the third tunneling layer 40c may be commonly referred to as an "upper PMA layer." In FIGS. 1 through 4, an upper electrode (not shown) may be disposed on the free layer 50.

Next, PMA characteristics of the perpendicular MTJ devices according to example embodiments will be described with reference to FIGS. 5 and 6.

Figure 5:
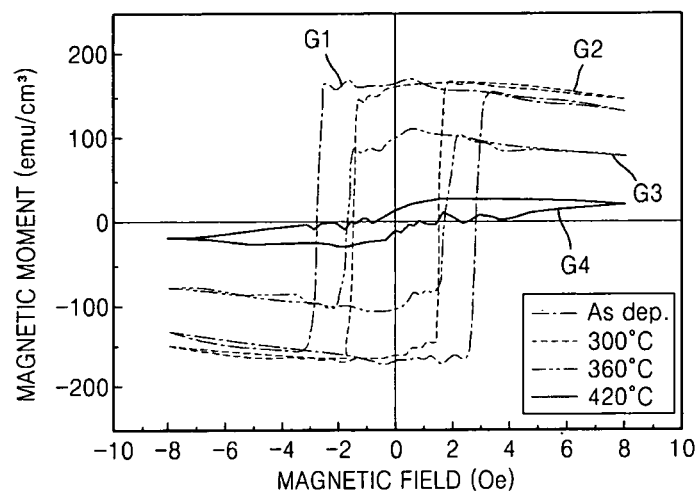
FIGS. 5 and 6 are graphs showing a magnetic field according to a magnetic moment measured in the perpendicular MTJ device of FIG. 4 for different temperatures according to example embodiments.

FIG. 5 shows a magnetic field according to a magnetic moment measured in the perpendicular MTJ device of FIG. 4 for different temperatures (i.e., a perpendicular hysteresis loop).

In order to measure the perpendicular hysteresis loop, the pinned layer 30 includes ten pairs of material layers, and the free layer 50 includes ten pairs of material layers in FIG. 4. The first RE-TM layers 30a and 30b forming each material layer in the pinned layer 30 are, respectively, a CoFe layer having a thickness of 12 Å and a Tb layer having a thickness of 6 Å. The first and second RE-TM layers 50a and 50b forming each of the material layers in the free layer 50 are, respectively, a Tb layer having a thickness of 6 Å and a CoFe layer having a thickness of 12 Å. The perpendicular MTJ device of FIG. 4 having the pinned layer 30 and the free layer 50 will hereinafter be referred to as a "first perpendicular MTJ device."

In FIG. 5, a first graph G1 shows a change in a magnetic field-magnetic moment of the first perpendicular MTJ device which is measured right after forming the first perpendicular MTJ device without performing an annealing operation. Second through fourth graphs G2, G3 and G4 show changes in the magnetic field-magnetic moment measured after forming the first perpendicular MTJ device and annealing the first perpendicular MTJ device at temperatures of 300° C., 360° C. and 420° C., respectively.

Referring to the first through fourth graphs G1-G4 of FIG. 5, when the annealing operation is not performed after forming the first perpendicular MTJ device, the first perpendicular MTJ device has PMA characteristics. When the first perpendicular MTJ device is annealed at a temperature of 300° C. and a temperature of 360° C., the first perpendicular MTJ device has PMA characteristics. When the first perpendicular MTJ device is annealed at a temperature of 420° C., the PMA characteristics of the first perpendicular MTJ device are substantially weakened.

As shown in the first through fourth graphs G1-G4 of FIG. 5, the perpendicular MTJ device according to example embodiments maintains the PMA characteristics to at least a temperature of about 360° C. That is, maintaining the PMA characteristics up to the annealing temperature of at least 360° C. means that the RE-TM layers of the pinned layer 30 and the RE-TM layers of the free layer 50 in the perpendicular MTJ device according to example embodiments maintain the amorphous states up to the annealing temperature of at least 360° C. Accordingly, when the first tunneling layer 40a having a lower crystallizing temperature than that of the pinned layer 30 and the third tunneling layer 40c having the lower crystallizing temperature than that of the free layer 50 are crystallized, the pinned layer 30 does not affect the first tunneling layer 40a and the free layer 50 does not affect the third tunneling layer 40c. The first and third tunneling layers 40a and 40c may be crystallized according to the crystallization structure of the second tunneling layer 40b, for example, the MgO layer. The tunneling layer 40 may have the coherent tunneling property, and thus the perpendicular MTJ device according to example embodiments may maintain a substantially high magnetic resistance (MR) ratio.

Figure 6:
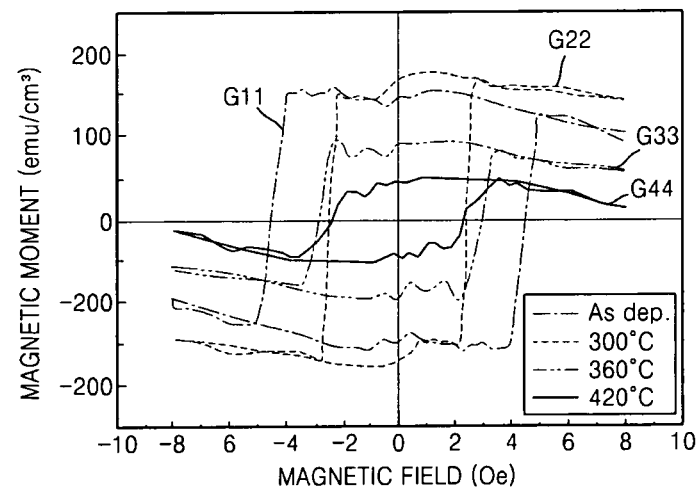

FIG. 6 shows results of measuring a magnetic field versus magnetic moment measured in a second perpendicular MTJ device according to example embodiments.

The second perpendicular MTJ device used in FIG. 6 has the same structure as that of the first perpendicular MTJ device except for the thicknesses of the pinned layer 30 and the free layer 50. In more detail, the first and second RE-TM layers 30a and 30b forming each of the material layers in the pinned layer 30 have a thickness of 8 Å and 4 Å, respectively. In addition, the first and second RE-TM layers 50a and 50b forming each of the material layers in the free layer 50 have a thickness of 4 Å and 8 Å, respectively.

In FIG. 6, first through fourth graphs G11, G22, G33 and G44 are obtained under the same conditions as those of the first through fourth graphs G1, G2, G3 and G4 shown in FIG. 5.

Referring to the first through fourth graphs G11, G22, G33 and G44 of FIG. 6, like the first perpendicular MTJ device, the PMA characteristics of the second perpendicular MTJ device are maintained to the annealing temperature of 360° C. after forming the second perpendicular MTJ device.

From the results shown in FIGS. 5 and 6, it is recognized that the PMA characteristics of the first and second perpendicular MTJ devices are similar to each other, even when the thickness of the pinned layers and the thickness of the free layers are different from each other in the first and second perpendicular MTJ devices having the same structure.

Next, a semiconductor device including the perpendicular MTJ device according to example embodiments will be described as follows.

Figure 7:
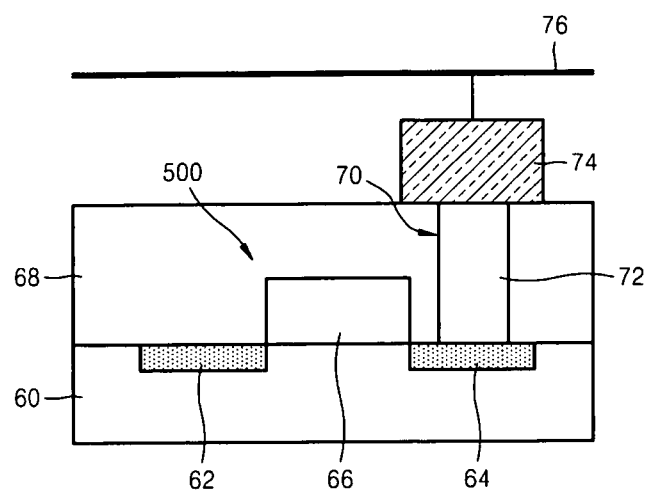
FIGS. 7 and 8 are schematic cross-sectional views of electronic devices including the perpendicular MTJ device according to example embodiments.

FIG. 7 schematically shows a magnetic random access memory (MRAM) device including a perpendicular MTJ device according to example embodiments.

Referring to FIG. 7, a semiconductor transistor 500 of a MRAM device including a first and second impurity regions 62 and 64 in a substrate 60 and a gate 66 disposed on the substrate 60 is illustrated.

The substrate 60 may be any kind of substrate with which the semiconductor transistor may be formed, for example, a p-type or an n-type silicon substrate.

The first and second impurity regions 62 and 64 are doped with impurities that are opposite types to the substrate 60. One of the first and second impurity regions 62 and 64 may be a source, and the other may be a drain. The gate 66 exists on a part of the substrate 60 between the first and second impurity regions 62 and 64.

The gate 66 may include a gate insulating layer and a gate electrode, but the gate 66 is represented as a single layer in FIG. 7, for the sake of convenience.

An interlayer dielectric 68 covering the transistor is formed on the substrate 60. A contact hole 70 exposing the second impurity region 64 is formed in the interlayer dielectric 68, and the contact hole 70 is filled with a conductive plug 72.

A perpendicular MTJ device 74 covering an upper surface of the conductive plug 72 is disposed on the interlayer dielectric 68. The perpendicular MTJ device 74 may be one of the perpendicular MTJ devices shown in FIGS. 1 through 4. Another conductive member (not shown) may be further disposed between the conductive plug 72 and the perpendicular MTJ device 74. A conductive wire 76 is connected to the perpendicular MTJ device 74. The conductive wire 76 may be directly connected to a free layer of the perpendicular MTJ device 74, or indirectly connected to the free layer via an upper electrode formed on the free layer. The conductive wire 76 may be a bit line.

The perpendicular MTJ device according to example embodiments may be applied to other devices besides the MRAM shown in FIG. 7. For example, the perpendicular MTJ device according to example embodiments may be applied to semiconductor memory related devices, or magnetic memory devices including an MTJ.

Figure 8:
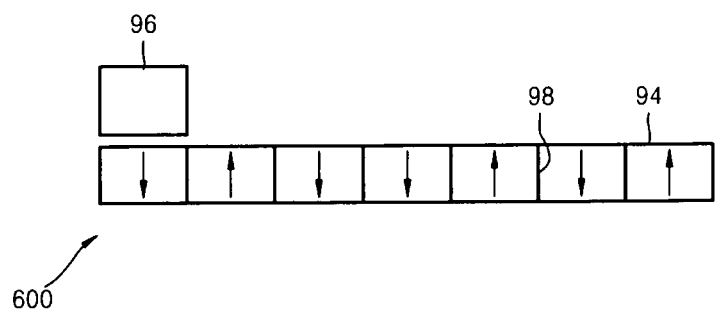

FIG. 8 is a schematic cross-sectional view of a magnetic packet memory (MPM) including a perpendicular MTJ device according to example embodiments.

Referring to FIG. 8, a perpendicular MTJ device according to example embodiments may be applied to a perpendicular magnetic recording head, or may be used as a magnetic head 96 for recording/reading data to/from a magnetic domain movement recording medium 94 of a magnetic packet memory (MPM) 600.

In FIG. 8, reference numeral 98 denotes a magnetic domain wall, and vertical arrows denote vertical magnetic polarization (i.e., recorded data) in each of the magnetic domains in the recording medium 94.

In addition, an MTJ of a magnetic logic circuit that performs logic operations by using the MTJ may be substituted by the perpendicular MTJ according to example embodiments.

Next, a method of manufacturing a perpendicular MTJ device according to examples embodiment will be described with reference to FIGS. 9 through 12.

Figure 9:
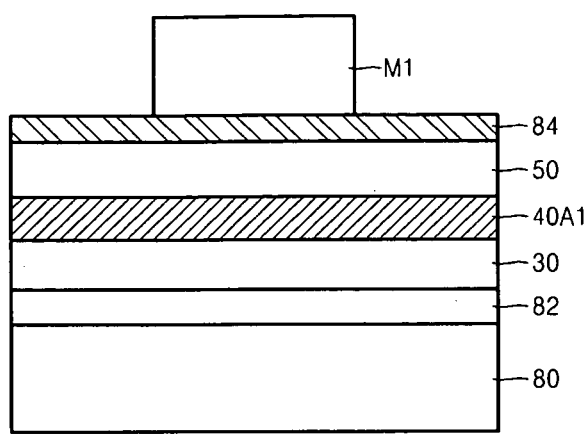
FIGS. 9 through 12 are cross-sectional views illustrating a method of fabricating a perpendicular MTJ device according to example embodiments.
Figure 10:
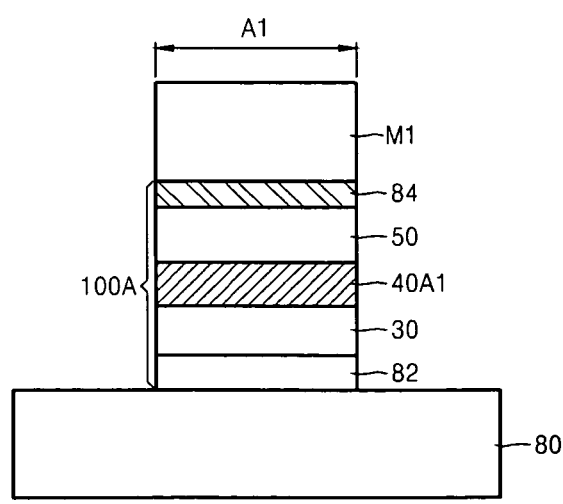

Referring to FIG. 9, a pinning layer 82, a pinned layer 30, a tunneling layer 40A1, a free layer 50 and a capping layer 84 are sequentially stacked on a substrate 80 in the order stated. An additional material layer may be further disposed between the substrate 80 and the pinning layer 82. For example, a seed layer (not shown) for growing the pinning layer 82 may be further formed between the substrate 80 and the pinning layer 82.

The substrate 80 may be a base material layer on which an MTJ device is formed. For example, the substrate 80 may be an interlayer dielectric. Here, the interlayer dielectric may include a device electrically connected to the MTJ device, or a medium affecting or affected by the MTJ device. The device that is electrically connected to the MTJ device may be a switching device (e.g., a transistor or a diode).

The pinned layer 30 may be formed of an amorphous PMA material. The pinned layer 30 may have a single layer structure, or may have a multi-layered structure like the pinned layer 30 shown in FIG. 1. The pinning layer 82 may be formed of an iron-manganese (FeMn) layer, an iridium-manganese (IrMn) layer, a nickel-manganese (NiMn) layer or a platinum-manganese (PtMn) layer.

The tunneling layer 40A1 may have a single-layer structure, or a multi-layered structure. When the tunneling layer 40A1 is formed to have a single layer structure, the uppermost layer of the pinned layer 30 (i.e., the layer directly contacting the tunneling layer 40A1) may be an amorphous magnetic layer doped with impurities. A temperature at which the amorphous magnetic layer doped with the impurities is crystallized may be lower than the crystallization temperature of the pinned layer 30. The amorphous PMA material layer doped with impurities may be a CoFeB layer. When the tunneling layer 40A1 is a single layer, the tunneling layer 40A1 may be formed of an MgO layer.

When the tunneling layer 40A1 is formed to have the multi-layered structure, the tunneling layer 40A1 may have the same structure as that of the tunneling layer 40 shown in FIG. 2. Here, the first tunneling layer 40a and the third tunneling layer 40c are amorphous magnetic layers doped with impurities, for example, CoFeB layers. The crystallization temperature of the first tunneling layer 40a is lower than that of the pinned layer 30 having the multi-layered structure. The free layer 40 may be formed to have a single-layer structure, or a multi-layered structure. However, when the pinned layer 30 is formed to have the single-layer structure, the free layer 50 may have the multi-layered structure. When the pinned layer 30 is formed to have the multi-layered structure, the free layer 50 may have the single-layer structure, or the multi-layered structure. When the free layer 50 has the multi-layered structure, the free layer 50 may have the same structure as the free layer 50 shown in FIG. 3. When the free layer 50 is formed having the single-layer structure formed of the amorphous PMA material, the tunneling layer 40A1 may have the same structure as the tunneling layer 40 shown in FIG. 2. Here, the third tunneling layer 40c directly contacting the free layer 50 may be an amorphous PMA material layer doped with impurities, for example, the CoFeB layer. The free layer 50 may be an amorphous magnetic layer, the crystallization temperature of which is higher than that of the third tunneling layer 40c.

The capping layer 84 is formed on the free layer 50. The capping layer 84 is a conductive layer that protects the free layer 50 and may function as an upper electrode. A mask M1 (defining a region on which the MTJ device will be formed) is formed on a set region of the capping layer 84. The mask M1 may be, for example, a photosensitive pattern layer.

The capping layer 84 around the mask M1 is etched. The etching operation is sequentially performed with respect to the layers formed under the capping layer 84 until the substrate 80 is exposed.

After performing the above etching operation, an MTJ pattern 100A is formed on the MTJ forming region A1 defined by the mask M1 on the substrate 80. After the etching operation, the mask M1 is removed.

Figure 11:
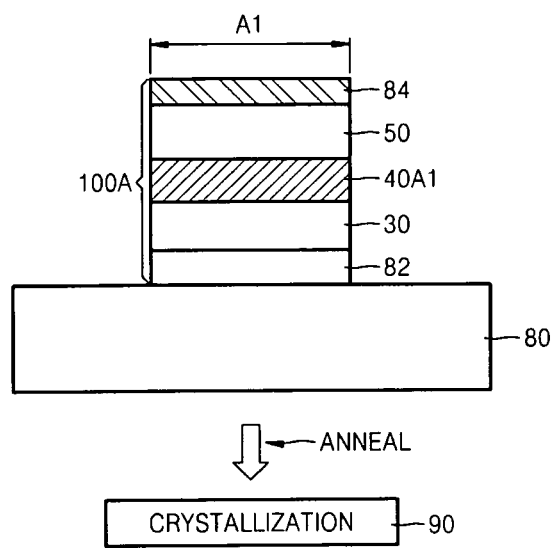

Referring to FIG. 11, the resultant structure on which the MTJ pattern 100A is formed is annealed such that the structure is crystallized (90). The annealing operation is performed to crystallize the amorphous magnetic layers doped with impurities (e.g., CoFeB layers) included in the pinned layer 30 and the free layer 50, which contact the tunneling layer 40A1 when the tunneling layer 40A1 is a single layer. When the tunneling layer 40A1 has the multi-layered structure, the annealing operation is performed to crystallize the amorphous tunneling layer doped with impurities, which contacts the pinned layer 30, and the amorphous tunneling layer doped with the impurities, which contacts the free layer 50. The amorphous magnetic layer doped with impurities is crystallized at a lower temperature than the crystallization temperatures of the pinned layer 30 and the free layer 50. As such, the pinned layer 30 and the free layer 50 maintain the amorphous states during the annealing operation. Thus, the amorphous magnetic layers doped with impurities, which contact the pinned layer 30 and the free layer 50, are not affected by the pinned layer 30 and the free layer 50 during the crystallization. The amorphous tunneling layer doped with impurities, which contacts the pinned layer 30 and the free layer 50, may be crystallized according to the crystallization structure of a center (or intermediate) tunneling layer (i.e., the tunneling layer (MgO layer) that does not contact the pinned layer 30 and the free layer 50). The spin-polarized current may flow through the tunneling layer 40A1 in the manner of coherent tunneling. The above annealing operation may be performed at a temperature of about 300° C. Because the pinned layer 30 and the free layer 50 are amorphous during the annealing operation, the pinned layer 30 and the free layer 50 maintain the PMA characteristics thereof, similar to before the annealing operation.

Figure 12:
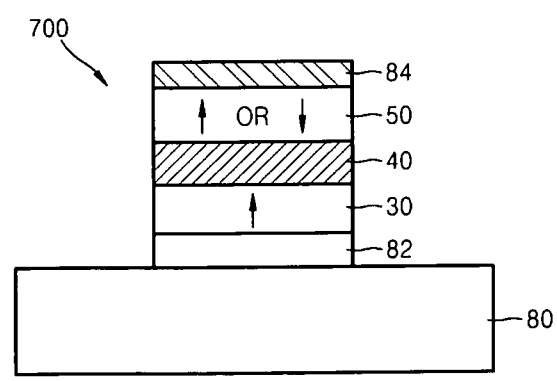

After the crystallization, the perpendicular MTJ structure 700 (including the pinning layer 82, the pinned layer 30, the tunneling layer 40, the free layer 50 and the capping layer 84) is formed on the substrate 80, as shown in FIG. 12. Here, the tunneling layer 40 is not amorphous because the entire tunneling layer 40 is crystallized due to the annealing operation.

In FIG. 12, an arrow in the pinned layer 30 denotes a fixed magnetization direction of the pinned layer 30. The magnetization direction of the pinned layer 30 may be opposite to the direction shown in FIG. 12. Arrows in the free layer 50 denote the magnetization direction of the free layer 50. The magnetization direction of the free layer 50 may be changed by an external magnetic field, or the spin-polarized current.

The perpendicular MTJ of according to example embodiments uses the RE-TM multi-layer as the pinned magnetic layer and/or the free magnetic layer. The multi-layer maintains the amorphous status after the thermal process at the temperature of 300° C. or higher. The multi-layer does not affect the crystallization of CoFeB in the tunneling layer of the CoFeB/MgO/CoFeB structure. A substantially high magnetic resistance ratio may be ensured by using the coherent tunneling.

In addition, the number of repetition layers of the RE-TM that is used as the free layer may be adjusted so as to adjust the saturation magnetization. The switching current of the free layer using the spin-polarized current may be reduced, and the switching of the free layer may be easily controlled.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A perpendicular magnetic tunnel junction (MTJ) device, comprising:
    a pinned layer;
    a pinning layer under the pinned layer;
    a tunneling layer on the pinned layer; and
    a free layer on the tunneling layer,
    wherein at least one of the pinned layer and the free layer has a multi-layered structure including an amorphous perpendicular magnetic anisotropy (PMA) material.

2. The perpendicular MTJ device of claim 1, wherein the pinned layer includes at least a pair of material layers that are sequentially stacked.

3. The perpendicular MTJ device of claim 2, wherein the pair of material layers are a first amorphous rare earth-transition metal (RE-TM) layer and a second amorphous RE-TM layer.

4. The perpendicular MTJ device of claim 1, wherein the free layer includes at least a pair of material layers that are sequentially stacked.

5. The perpendicular MTJ device of claim 4, wherein the pair of material layers are a first amorphous rare earth-transition metal (RE-TM) layer and a second amorphous RE-TM layer.

6. The perpendicular MTJ device of claim 3, wherein the first RE-TM layer is at least one selected from the group consisting of a cobalt-iron (CoFe) layer, iron-platinum (FePt), Cobalt-platinum and combinations thereof,
    and the second RE-TM layer includes a lanthanide.

7. The perpendicular MTJ device of claim 6, wherein the first RE-TM layer is a cobalt-iron (CoFe) layer, and the second RE-TM layer is a terbium (Tb) layer.

8. The perpendicular MTJ device of claim 5, wherein the first RE-TM layer includes a lanthanide, and
    and the second RE-TM layer is at least one selected from the group consisting of a cobalt-iron (CoFe) layer, iron-platinum (FePt), Cobalt-platinum and combinations thereof.

9. The perpendicular MTJ device of claim 8, wherein the first RE-TM layer is a terbium (Tb) layer, and the second RE-TM layer is a cobalt-iron (CoFe) layer.

10. The perpendicular MTJ device of claim 1, wherein the tunneling layer includes an MgO layer.

11. The perpendicular MTJ device of claim 10, wherein the tunneling layer includes a first tunneling layer, the MgO layer and a second tunneling layer, which are stacked sequentially.

12. The perpendicular MTJ device of claim 10, wherein at least one of the pinned layer and the free layer includes an RE-TM layer doped with impurities, and the RE-TM layer contacts the MgO layer and is capable of being crystallized according to a crystallization structure of the MgO layer.

13. The perpendicular MTJ device of claim 12, wherein the RE-TM layer is a cobalt-iron-boron (CoFeB) layer.

14. The perpendicular MTJ device of claim 11, wherein the first and second tunneling layers are RE-TM layers doped with impurities, and the RE-TM layers is capable of being crystallized according to a crystallization structure of the MgO layer.

15. The perpendicular MTJ device of claim 14, wherein the RE-TM layer is a cobalt-iron-boron (CoFeB) layer.

16. The perpendicular MTJ device of claim 1, further comprising:
    a capping layer on the free layer.

17. A magnetic memory device, comprising:
    a switching device; and
    a magnetic tunnel junction (MTJ) device connected to the switching device,
    wherein the MTJ device is the perpendicular MTJ device according to claim 1.

18. A magnetic packet memory (MPM), comprising:
    an MTJ device, wherein the MTJ is the perpendicular MTJ device according to claim 1.

19. A magnetic logic device, comprising:
    a magnetic tunneling junction (MTJ) device configured to perform logic operations, wherein the MTJ device is the perpendicular MTJ device according to claim 1.

20. A method of manufacturing a perpendicular magnetic tunnel junction (MTJ) device, the method comprising:
    stacking a pinning layer, a pinned layer, a tunneling layer and a free layer sequentially on a substrate;
    patterning the pinning layer, the pinned layer, the tunneling layer, and the free layer to form an MTJ pattern; and
    annealing the MTJ pattern, wherein at least one of the pinned layer and the free layer is formed to have a multi-layered structure including an amorphous perpendicular magnetic anisotropy (PMA) material.

21. The method of claim 20, wherein the tunneling layer includes an MgO layer.

22. The method of claim 21, wherein at least one of the pinned layer and the free layer includes a first material layer directly contacting the MgO layer, the first material layer being formed as an amorphous material layer that is crystallized during annealing of the MTJ pattern.

23. The method of claim 22, wherein at least one of the pinned layer and the free layer includes a second material layer that does not contact the MgO layer, the second material layer being formed as an amorphous rare earth-transition metal (RE-TM) layer that is crystallized at a temperature higher than the crystallization temperature of the material layer contacting the MgO layer.

24. The method of claim 23, wherein the amorphous RE-TM layer is a cobalt-iron (CoFe) layer or a terbium (Tb) layer.

* * * * *